United States Patent
Skovenborg et al.

(10) Patent No.: US 9,661,435 B2
(45) Date of Patent: May 23, 2017

(54) LOUDNESS METER AND LOUDNESS METERING METHOD

(71) Applicant: The TC Group A/S, Risskov (DK)

(72) Inventors: Esben Skovenborg, Aarhus C (DK); Ivar Iversen, Aarhus C (DK)

(73) Assignee: MUSIC GROUP IP LTD., Tortola (VG)

(*) Notice: Subject to any disclaimer, the term of this patent is extended or adjusted under 35 U.S.C. 154(b) by 119 days.

(21) Appl. No.: 14/472,555

(22) Filed: Aug. 29, 2014

(65) Prior Publication Data
US 2016/0066114 A1 Mar. 3, 2016

(51) Int. Cl.
| | | |
|---|---|---|
| *H04R 29/00* | (2006.01) | |
| *H03G 3/30* | (2006.01) | |
| *G01H 3/14* | (2006.01) | |
| *H04S 7/00* | (2006.01) | |
| *H03G 9/02* | (2006.01) | |

(52) U.S. Cl.
CPC ......... *H04R 29/008* (2013.01); *H03G 3/3005* (2013.01); *G01H 3/14* (2013.01); *H03G 9/025* (2013.01); *H04R 29/00* (2013.01); *H04R 2430/01* (2013.01); *H04S 7/40* (2013.01)

(58) Field of Classification Search
USPC .......................................................... 700/94
See application file for complete search history.

(56) References Cited

U.S. PATENT DOCUMENTS

| | | | | |
|---|---|---|---|---|
| 7,546,213 | B1* | 6/2009 | Skovenborg | H04R 29/008 345/440 |
| 7,820,900 | B2* | 10/2010 | Lemons | G09B 15/023 345/10 |
| 8,504,181 | B2* | 8/2013 | Seefeldt | G10L 25/69 700/94 |
| 8,560,303 | B2* | 10/2013 | Beack | H04S 3/008 704/200 |
| 2007/0291959 | A1* | 12/2007 | Seefeldt | H03G 3/32 381/104 |
| 2015/0033123 | A1* | 1/2015 | Arrasvuori | G06F 3/165 715/716 |
| 2015/0036842 | A1* | 2/2015 | Robinson | G06F 3/165 381/103 |

OTHER PUBLICATIONS

Loudness Metering Round Up and Reviews by Mike Thornton, Pro Tools expert ( Dec. 13, 2013 ).*

* cited by examiner

*Primary Examiner* — Tan X Dinh
(74) *Attorney, Agent, or Firm* — Cantor Colburn LLP

(57) ABSTRACT

A dual loudness meter is disclosed, simultaneously displaying the current loudness of an audio signal and of a processed audio signal, and also displaying the previous loudness of both audio signals.

10 Claims, 10 Drawing Sheets

LOUDNESS METER AND LOUDNESS METERING METHOD

BACKGROUND

The present invention relates to loudness meters for displaying various aspects of loudness of audio signals.

The loudness of a music track or radio/TV program is one of the most important perceptual properties of the sound. Therefore loudness meters are often employed at different stages of broadcast and music production. A loudness meter can measure (i.e. estimate) one or more types of loudness of an audio signal, and display the loudness estimates or levels. By reading the loudness meter, the producer or audio engineer can get an impression of the loudness without having to spend the time listening for the duration of each program.

Figure 1:
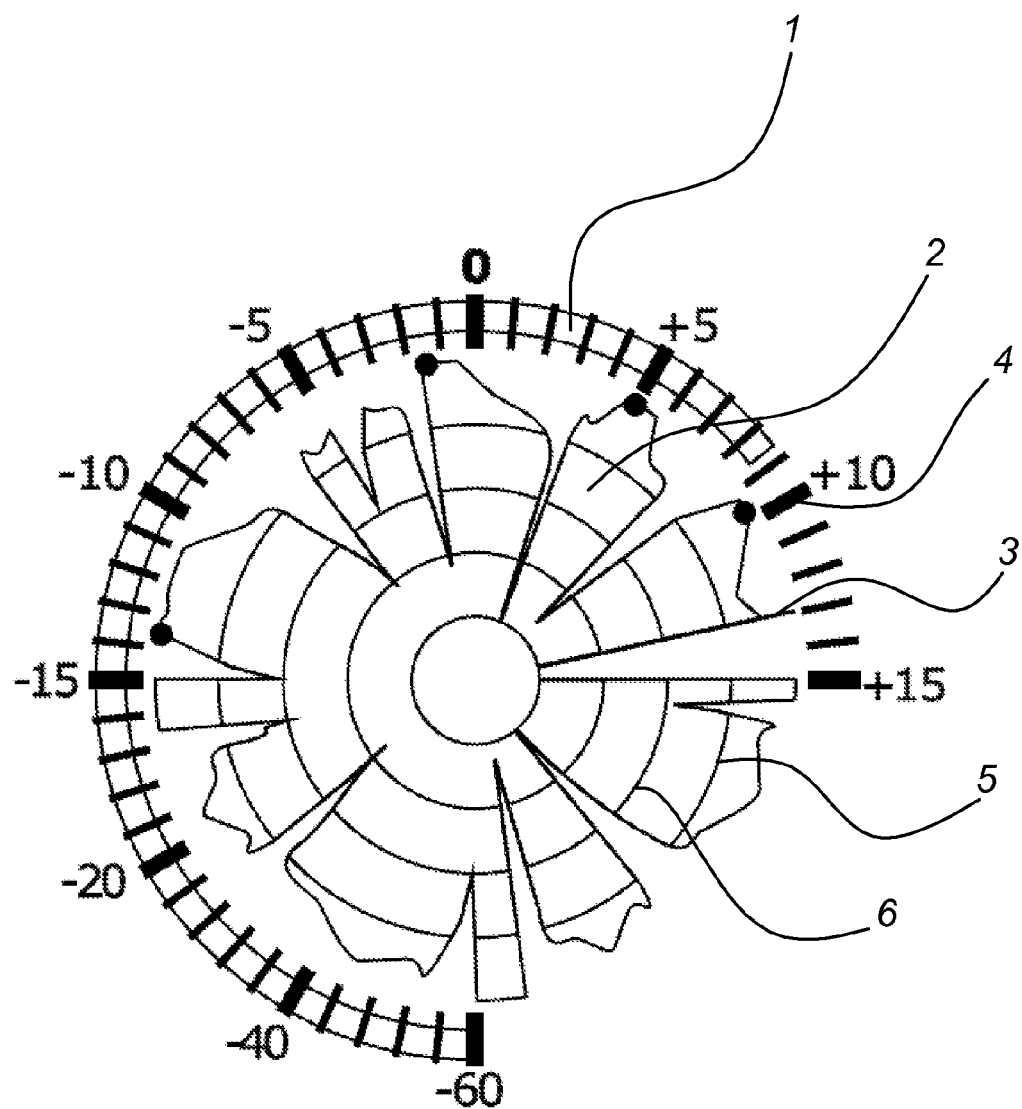

Advanced loudness meters can display both the current loudness and its 'history', that is, the previous loudness estimates. An example of such a loudness meter is shown in FIG. 1 (prior art).

In an audio production, some kind of audio processor is normally employed to continuously control/adjust the 'volume', loudness, or spectral/dynamic balance of the sound. Such processors may be known as dynamic-range compressors, limiters, automatic loudness controllers, multiband compressors, dynamic equalizers, loudness maximizers, exciters, etc.

It is common practice to meter the loudness and history at the output of such an audio processor. Thereby the audio engineer will be able to monitor and control the loudness resulting from the processing, by means of numerical and/or graphical representations of various loudness measures. For instance, it could be verified whether certain loudness measures are compliant with the technical standards and recommendations that applies to different fields of audio production.

In some cases, it may be useful to monitor the loudness at the input as well as at the output of an audio processor, or of a chain of multiple audio processors. A setup like that would allow the engineer to inspect the effective changes made by the processor(s), as well as the resulting loudness.

However, in order to establish such a metering setup, the engineer would have to employ two individual loudness meters, which may be impractical, clumsy, and uneconomic. Furthermore, to be able to compare the displays on these two meters, every measurement- and display-parameter of the meters would carefully have to be set up identically. Even then, it might be inconvenient to accurately compare the displays of the two meters, as it would involve reading the two separate displays.

When a new type of program or audio signal begins the meters would typically need to be reset, in order to clear the level history and null the filter states, signal buffers etc. In a two-meter setup, such a reset operation would need to be manually performed on both meters—as close in time as possible to each other—in order not to skew their relative time base.

SUMMARY

The inventor has identified the above-mentioned problems and challenges related to loudness meters and subsequently made the below-described invention with an object of improving monitoring of audio processors and/or improving usability of loudness meters and/or improving performance of loudness meters and/or improving loudness meter processing.

In an aspect the present invention relates to a loudness meter comprising a display unit and a loudness estimator, said loudness estimator being arranged to establish loudness estimates of an audio signal and of a processed audio signal, the processed audio signal being derived from said audio signal, said loudness meter being arranged to indicate representations of loudness estimates of the audio signal and of the processed audio signal on said display unit, the representations comprising at least a representation of a current of said loudness estimates of each of the audio signal and the processed audio signal, and a representation of previous of said loudness estimates of each of the audio signal and the processed audio signal.

By "processed audio signal" is referred to an audio signal derived from an original or otherwise upstream audio signal by means of processing by one or more audio processors, or by any other means of signal processing in the broadest sense.

In a preferred embodiment, the audio signal and the processed audio signal may be the input and the output signals, respectively, of an audio processor. Thereby the present invention would advantageously provide a visualization of the effective processing of the signal by the audio processor, i.e. how the estimated loudness is changed by the processing. In a preferred embodiment the processing of the audio signal is performed in real-time, i.e. using substantially 1 minute to process 1 minute of the audio signal, whereby also the indication on the display of current and previous loudness estimates refer to real-time with respect to the audio signal. This does not imply that the source of the audio signal is a live feed; it may be a live or delayed-live feed, as well as recorded or otherwise pre-generated programme material, or a composition thereof.

This may aid the user in setting or adjusting the parameters of the audio processor(s). Furthermore, the provided visualization has a surprising technical effect on the employment, utilization and performance of audio processors that affect loudness, as an educational effect obtained by the visualization of the present invention in helping the user understand the effect of the numerous technical parameters of such audio processor(s), will cause further refinement of the settings to improve performance. A further effect of the invention is facilitation of user effectiveness and productivity as the effect on loudness of changing processing parameters can be readily seen and thereby may reduce the time spent with trying different settings or figuring out what causes a certain non-optimal processing.

The audio signal could be processed by a single device, a chain of devices, or a single device implementing multiple processing algorithms, each of which might affect the loudness. One or more of these processors could have no inherent meter displays. Or, if a processor had a display, it might be too simplistic or inaccurate due to "metering" not being the primary function of the device. Thus an advantageous embodiment makes it practical and convenient for the user having to read only a single meter, known to be accurate.

When a new type of program or audio signal begins a loudness meter would typically need to be reset, in order to clear the level history and null the filter states, signal buffers etc. In the present invention, the reset operation may advantageously be performed for the loudness estimators of both the audio signal and the processed audio signal, at exactly the same time. The loudness estimation would thus be resumed with equal initial conditions for the analysis of both signals.

Moreover, the loudness representations for the audio signal and the processed audio signal are in a preferred embodiment computed using identical measurement- and display-parameters.

The above-described advantageous features individually or in combinations provide for the user to safely rely on any differences displayed as resulting from actual loudness differences in the signals, and not, for instance, an artifact of the analysis of the 2 signals being misaligned or computed with different parameters. This may be advantageous with regards to general monitoring where it may suffice with a quick look at the loudness meter safe in the knowledge that the user does not have to verify that the parameters of individual loudness meters are comparable, as well as with regards to analysing the audio processing by means of the loudness meter where the user may adjust measurement- and display-parameters safe in the knowledge that they are adjusted equally for both signals, without the user having to ensure and remember that.

The user may accurately read, compare and contrast the representations corresponding to the signal and the processed signal, as they would be provided by the present invention on the same display, coordinate grid, or level axis etc.

From a perceptual point of view, loudness is overlapping with a number of related perceptual attributes. For instance sharpness, brightness, annoyance, fluctuation strength, and intelligibility are established as psychoacoustical attributes related to loudness. The loudness estimator of the present invention will preferably provide an estimate of the kind of loudness that is most relevant for the particular application of the invention.

Conversely, the loudness estimator may calculate the loudness estimates as defined in a certain standard or technical recommendation. For instance, the ISO 532 standard, whereby the loudness estimates would be represented in units of phon or sone. Another method for calculating loudness is defined in the ITU-R BS.1770 recommendation, whereby the loudness estimates would be represented in units of LKFS or LUFS. As the current loudness, it may be advantageous for the loudness estimator to measure the Momentary Loudness or the Short-term Loudness, defined in ITU-R BS.1771 and in the EBU R128 recommendation.

The representations of current and previous loudness estimates compliment each other: the current loudness corresponds to what would be perceived, if listening to the signal 'now', whereas the previous loudness provides a history of the processing that has already taken place. The previous loudness estimates may cover e.g. the past day, the past programme, or merely the past minute, depending on the application. Hence, it is an advantageous feature of the invention to allow the user to compare both the pair of current loudness estimates and the pair of previous estimates. In an embodiment the previous loudness estimates simply hold past of the current loudness estimates of a certain time interval or e.g. since the last reset. In an embodiment the previous loudness estimates do not comprise each individual past of the current loudness estimates, but are determined on the basis of past of the current loudness estimates. In an embodiment the previous loudness estimates are determined on the basis of the audio signal and the processed audio signal, respectively, e.g. in order to apply a different loudness estimation principle than the one applied for current loudness estimation.

In an embodiment, the display unit may be a display device of any kind, e.g. a dot-matrix display, a liquid crystal display, e.g. a TFT or LED, an organic light emitting diode OLED display, etc. In an embodiment the display unit is a display output for providing display information to an external display device, e.g. a computer monitor, an integrated display of an audio processor, a screen of a tablet or smartphone, etc. In an embodiment where the display unit is a display output, it may e.g. comprise a WiFi or wired LAN interface, a USB interface, a dedicated display transfer technology such as e.g. VGA, HDMI or DisplayPort, a memory or memory bus arranged to convey a data structure for rendering at a display device, or other serial or parallel data transfer technology suitable for driving a display device or providing data to an external display controller or processor for rendering at a display device.

In an embodiment the display unit may be shared with other applications such that one display unit is employed as e.g. user interface showing menus, parameters, etc., e.g. from an audio processor, as well as providing information from the loudness meter of the present invention. In an embodiment the loudness meter is integrated in an audio processor or a general purpose programmable device such as e.g. a tablet, a smartphone or a computer, etc.

In an advantageous embodiment said representation of a current of said loudness estimates of the audio signal and of the processed audio signal is indicated with respect to a common loudness axis.

By using a common loudness axis for the representations of current loudness, and thereby displaying loudness values in a comparable way, makes it easy for user to see to what degree e.g. a dynamics processor is currently applying positive or negative gain while processing the signal, while also seeing the actual levels of both signals. In an embodiment both representations of current loudness estimates are drawn on the display unit in alignment with a common loudness axis. In an embodiment the representations of current loudness estimates are drawn on the display unit relative to visually individual loudness axis representations, but both axes being of a common scale and offset, thereby being a common loudness axis. In an embodiment, e.g. based on any of the previously mentioned embodiments, the common loudness axis is not displayed.

In an advantageous embodiment said representation of a current of said loudness estimates of the audio signal and of the processed audio signal is indicated as a difference between the two estimates.

Displaying a single relative value difference may in some applications be preferable to the display of the two absolute values; for example if the current input and output had the same level, this would be easy for the user to detect as a "0" difference.

Positive and negative difference may be displayed in different colors, thereby emphasizing the direction of change currently performed by the processing. Thus, the user would immediately be able to see a loudness change 'trend' of the processing—without having to actually listen to—and perceptually compare—the loudness of the two audio signals.

In an embodiment both the two current loudness estimates as well as their difference may be displayed.

In an advantageous embodiment said representation of previous of said loudness estimates of the audio signal and of the processed audio signal is indicated with respect to a common loudness axis.

By using a common loudness axis for the representations of previous loudness, and thereby displaying previous loudness values in a comparable way, makes it easy for user to see the contrast between the two, i.e. what change has been performed by the audio processor during the past covered by the previous estimates. In an embodiment both representations of previous loudness estimates are drawn on the display unit in alignment with a common loudness axis. In an embodiment the representations of previous loudness estimates are drawn on the display unit relative to visually individual loudness axis representations, but both axes being of a common scale and offset, thereby being a common loudness axis. In an embodiment, e.g. based on any of the previously mentioned embodiments, the common loudness axis is not displayed.

In an embodiment the current and previous loudness estimates are represented with respect to a common loudness axis.

In an advantageous embodiment the axis orthogonal to the loudness axis, in the representation of previous of said loudness estimates, is a density axis.

Loudness estimates or levels having a high density would show the user that the signal has had those levels for a large proportion of the time.

Figure 2:
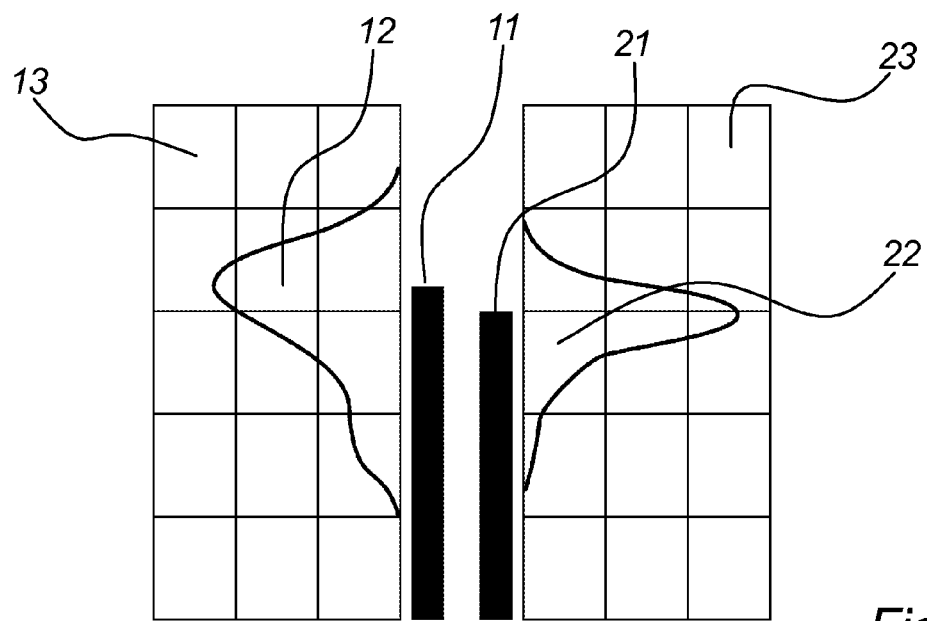
Figure 3:
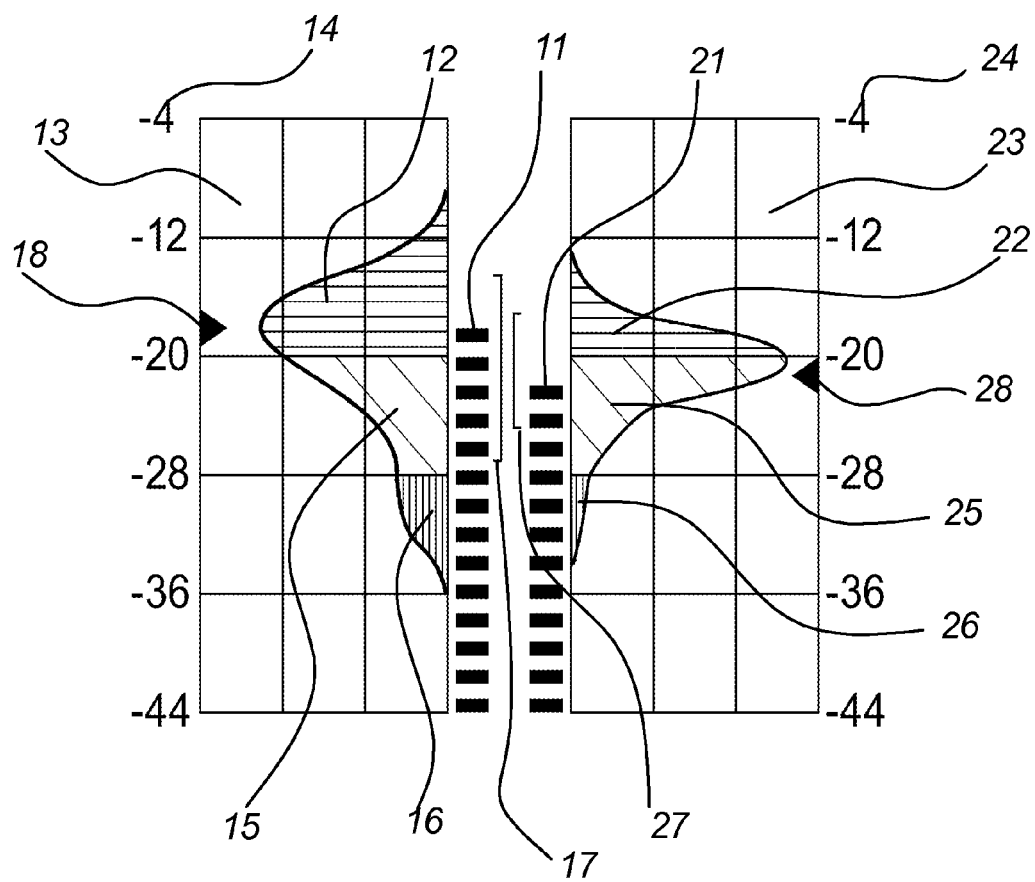

Furthermore, see the description of the embodiment in FIGS. 2 and 3.

In an advantageous embodiment the axis orthogonal to the loudness axis, in the representation of previous of said loudness estimates, is a time axis.

By representing the previous loudness estimates with respect to time, the user would be able to see the estimates or levels at specific times in the past, where the time may be marked as either relative or absolute (wall clock') time. This is advantageous if the user needs to inspect the processing of a certain passage or event in the program.

Figure 9:
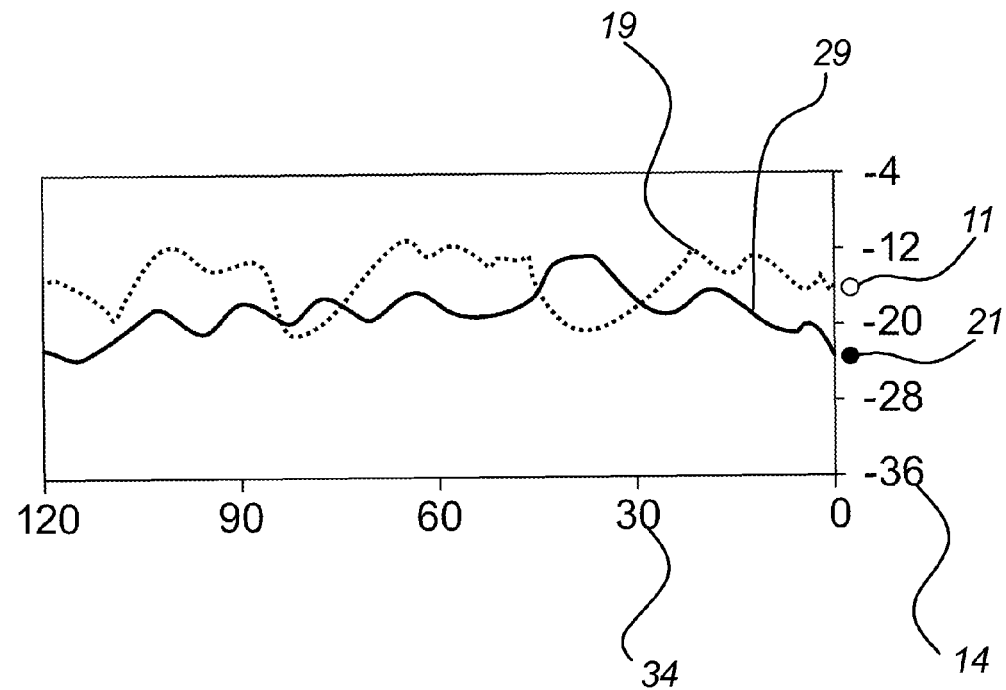

Furthermore, see the description of the embodiment in FIG. 9.

In an advantageous embodiment said indication of a representation of previous of said loudness estimates is based on a histogram view.

A finite number of 'bars' or other ways of representing discrete values may display a histogram of the previous loudness estimates. Each bar would correspond to a certain interval of the estimates, hence providing a display that is simple for the user to read and understand. Moreover, the bars may be aligned with 'round' numbers on the corresponding scale or axis. This would enable the user to easily compare the histograms corresponding to the signal and to the processed signal, as the bars would be aligned in the display, i.e. 'opposite bars' would correspond to the same interval of values.

Figure 5:
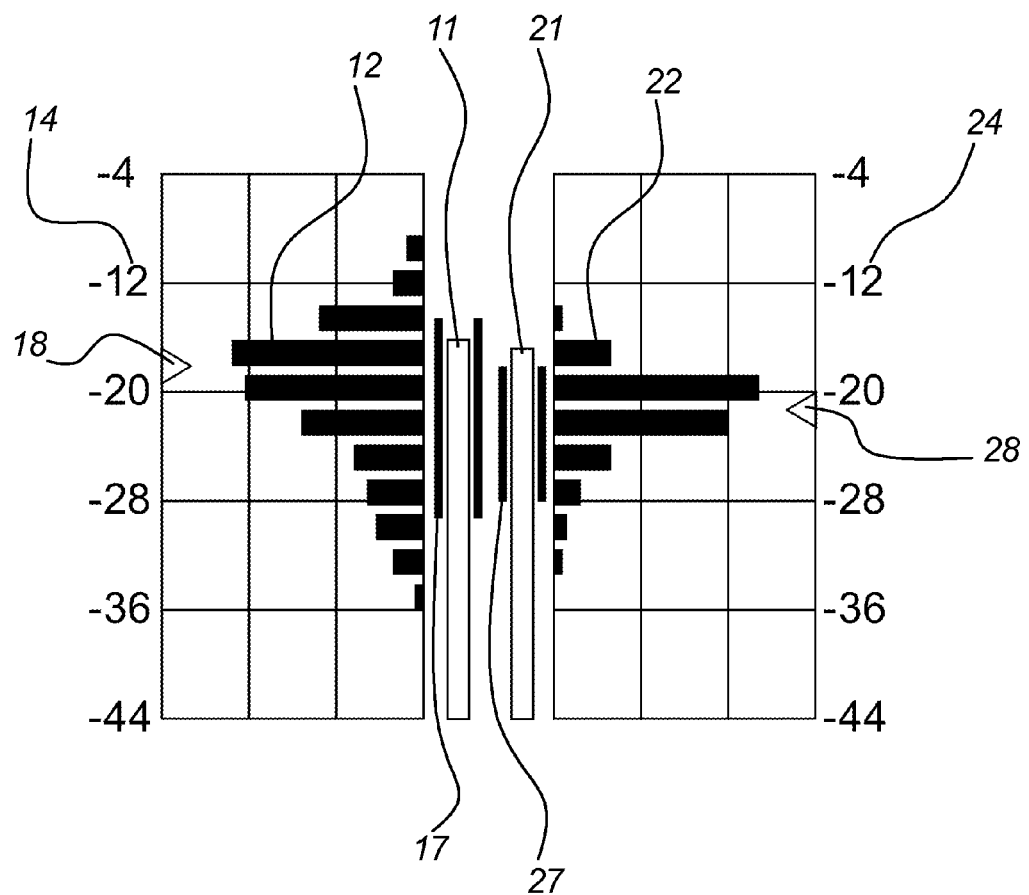

Furthermore, see the description of the embodiment in FIG. 5.

In an advantageous embodiment said indication of a representation of previous of said loudness estimates is based on a continuous distribution view.

Displaying a continuous distribution may provide a more natural representation to the user, as the loudness (level), on which the distribution is based, is itself continuous by nature. The continuous distribution would provide a representation of the 'shape' of the distribution.

By comparing the distributions corresponding to the signal and to the processed signal, the user would thus easily be able to detect any differences in the shape of the two distributions. Such differences would inform the user of changes in the loudness dynamics, resulting from the processing.

Furthermore, see the description of the embodiment in FIGS. 2 and 3.

In an advantageous embodiment said loudness meter is arranged to indicate a representation of a loudness range of each of the audio signal and the processed audio signal on said display unit, wherein the loudness range represents an interval of loudness estimates consisting of an upper estimated value and a lower estimated value.

The representation of loudness range—a loudness range indicator—would show the user within what range or interval the current loudness level typically lies.

In a preferred embodiment, the loudness range indicators are represented on the same scale or axis. Thereby the user would be able to immediately see whether the processing had resulted in a reduction or expansion of the loudness "dynamic range". The two indicators would also easily reveal if the processing had NOT changed the loudness dynamics but just the overall loudness (level), as the two loudness range indicators would then be shifted on their axis but otherwise identical (e.g. same length).

Such an indicator may be, for instance, graphical or numerical. Furthermore, see the description of the embodiment in FIG. 3.

In an advantageous embodiment said loudness meter is arranged to indicate a representation of an integrated loudness of each of the audio signal and the processed audio signal, wherein the integrated loudness is an overall loudness value based on previous of said loudness estimates.

The representation of an integrated loudness—an integrated loudness indicator—visualizes the integrated loudness which may correspond to the overall loudness of a broadcast programme or a music track or album, such that the integrated loudness would measure the normalization level that a production may be required to match. (Note that 'integrated', in this context, does not necessarily imply the calculation is based on a mathematical integration.)

In a preferred embodiment, the integrated loudness indicators are represented on the same scale or axis. Thereby the user may easily see whether the overall loudness of the processed audio is higher than or lower than (or equal to) that of the unprocessed audio—and by how much. This information is essential for the user to monitor and control easily.

In an embodiment, the integrated loudness is estimated as the Programme Loudness level, defined by the ITU-R BS.1770 or the EBU R128 recommendation, whereby the integrated loudness estimates would be represented in units of LU or LUFS.

Furthermore, see the description of the embodiment in FIG. 3.

In an advantageous embodiment said loudness meter comprises a storage arranged to store said representation of previous of said loudness estimates as a quantized distribution.

A quantized distribution, i.e. a data structure corresponding to a histogram view, may be an efficient method of storing past levels in digital hardware/software implementations of the present invention. For instance, the quantized distribution may be stored and maintained as an array of histogram bins, each holding the number of estimates within a corresponding interval.

An advantageous embodiment of the invention provides a display of the previous estimates as a pair of histograms, e.g. as described above. By storing/maintaining the previous estimates as a quantized distribution, preferably with quantization intervals corresponding to the histogram bars or an integer multiple thereof, it may require relatively little extra computation to prepare and display a histogram view based on the quantized distribution.

In an advantageous embodiment said loudness meter is arranged to determine the representation of previous of said loudness estimates by defining a plurality of time intervals and determine a single value representative for the previous loudness estimates of each time interval.

In an embodiment, consecutive loudness estimates may be integrated into a single loudness value, each of which are then stored instead of the original (previous) estimates, hence requiring less memory to store and maintain. Moreover, the subsequent computations may be faster as less data needs to be processed.

The representative values may be computed by a number of different methods. Advantageous to the present invention is that the previous loudness estimates corresponding to the signal and to the processed signal in an embodiment will always use the exact same method. If this was carried out in two independent units (i.e. prior art), small variations in the computation of representative values might lead to undesirable "false" differences in the resulting previous loudness estimates.

In an advantageous embodiment said loudness meter is arranged to determine said representation of previous of said loudness estimates by means of a finite-length sliding window.

In an embodiment any estimates 'older' than the length of a sliding window are discarded when establishing the representation of previous of said loudness estimates. The length of the sliding window may be user-adjustable, e.g. in a range from seconds to days. Thereby the user also influences the amount of detail (the resolution) of the representation of the previous estimates displayed. Advantageous to the present invention is that the length of the sliding window will automatically be the same for the previous loudness estimates corresponding to the signal and to the processed signal. When the window-parameters are changed by the user, the change immediately applies to both signals.

In an advantageous embodiment said loudness meter is arranged to apply a finite-length sliding window in combination with a quantized distribution representation of said previous of said loudness estimates.

In an advantageous embodiment the quantized distribution, e.g. corresponding to a statistical distribution or histogram, could thereby be updated by simply adding the most recent estimate, and removing the oldest estimate (i.e. the estimate at "the far end" of the sliding window). This operation might be considerably easier to perform than recomputing the histogram or distribution, each time the sliding window "slides" one step.

In an advantageous embodiment said loudness meter is arranged to establish said representation of previous of said loudness estimates by means of a set of IIR filters.

The IIR filters preferably correspond to neighboring intervals of loudness estimates, such that the set of IIR filters together cover the relevant range of loudness estimates. Due to the decay of the IIR filters, the older the estimate received by one of the IIR filters, the lower that estimate will be weighted in the representation.

The IIR filters might be of a "leaky integrator" type. In this embodiment the feedback coefficients or time-constants of the filters would conceptually substitute the "window-length" parameter of a finite length sliding-window.

Advantageous to the present invention is that the time-constants of the IIR filters will automatically be the same for the previous loudness estimates corresponding to the signal and to the processed signal. When the IIR filter parameters are changed by the user, the updated filter coefficients are calculated once, and then immediately applies to both signals.

In an advantageous embodiment said representation of previous of said loudness estimates is based on said representation of current of said loudness estimates.

One or more consecutive current estimates may be averaged or re-integrated into a form suitable for the desired representation of the previous estimates. In terms of computational complexity, this may be advantageous to estimating the previous loudness estimates directly from the audio signal.

The previous values may be calculated from the consecutive current values by a number of different methods. Advantageous to the present invention is that the previous loudness estimates corresponding to the signal and to the processed signal will always be based on the exact same method.

Figure 11:
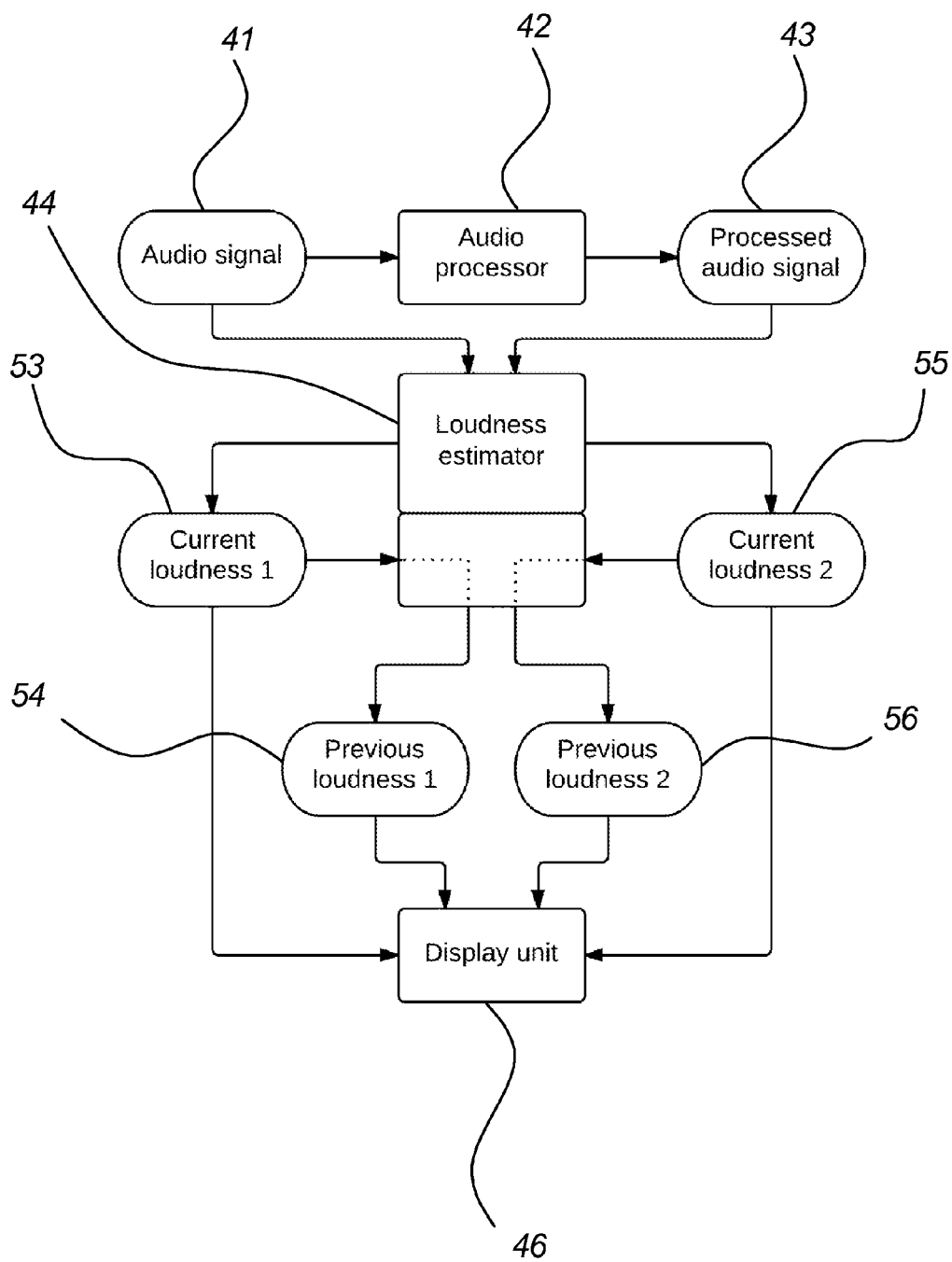

Furthermore, see the description of the embodiment in FIG. 11.

In an advantageous embodiment the loudness meter comprises a loudness estimator of a first type arranged to provide said current of said loudness estimates of said signal and said processed signal; and the loudness meter comprises a loudness estimator of a second type arranged to provide said previous of said loudness estimates of said signal and said processed signal.

In an embodiment the current loudness estimates are computed according to one method, and the previous loudness estimates are computed according to a different method. An example of this is when certain requirements apply to the 'ballistics' of the current loudness, that is, to obtain a certain dynamic behaviour of the meter, for visual reasons, such as a certain maximum fallback rate. These requirements may not apply to the previous loudness estimates, as their 'dynamics' are only observed in the history as a whole.

Advantageous to the embodiment is that each type of loudness estimator may be used to provide the loudness estimates of BOTH said signal and said processed signal. This gives an implementational advantage, as the dual use of the loudness estimator may yield a reduced code size and potential DSP optimizations by the identical processing of the two "data" in parallel. A further advantage is that the user can be certain that each loudness estimate of two signals are indeed processed by the same method with same parameters etc.

Figure 10:
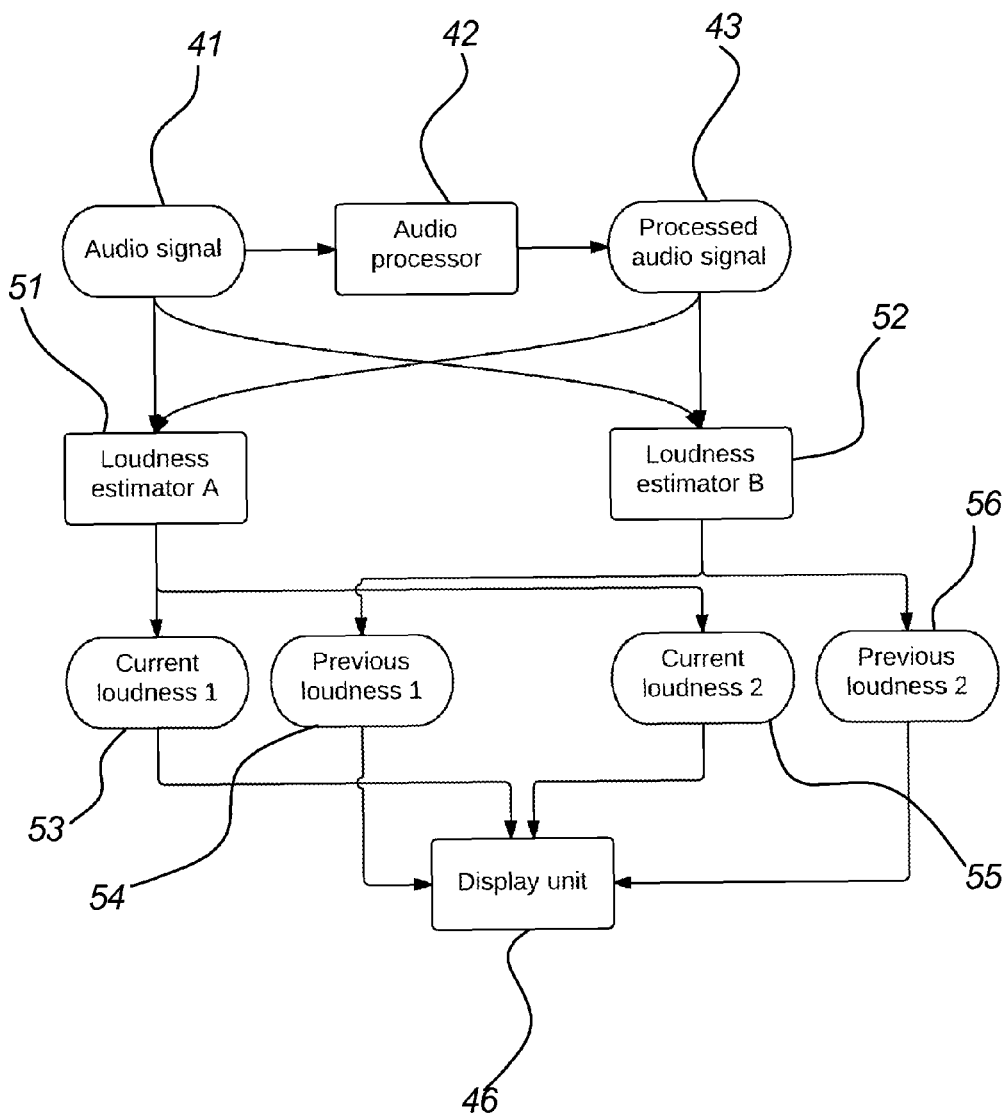

Furthermore, see the description of the embodiment in FIG. 10.

In an advantageous embodiment the loudness estimator is arranged to apply a method of providing loudness estimates commonly for both said signal and of said processed signal.

In an advantageous embodiment e.g. filter coefficients are shared, thereby saving computations as the filter coefficients are calculated only once, and reused by the loudness estimator.

In an advantageous embodiment e.g. digital signal processor DSP instructions are shared, thereby saving space in the DSP/CPU code memory.

Moreover, this approach guarantees that the calculations of the loudness estimates for the signal and the processed signal are based on the exact same parameters and constants.

In an advantageous embodiment said loudness estimator is integrated with an audio processor and arranged such that said processed audio signal is derived from said audio signal by the audio processor.

In an embodiment of the present invention, the loudness estimator is shared by the loudness meter and the audio processor, either in full or in part. It may be that the loudness estimates of the input signal and/or the output signal are computed by the audio processor in order to perform its loudness processing. In this case, separate loudness estimator(s) for embodiments of the present invention may be omitted or at least simplified, as the audio processor's loudness estimator(s) take their place. This is advantageous to the manufacturer and user of the audio processor, as the simplification described may lead to a reduction in cost and/or operational resources.

Figure 12:
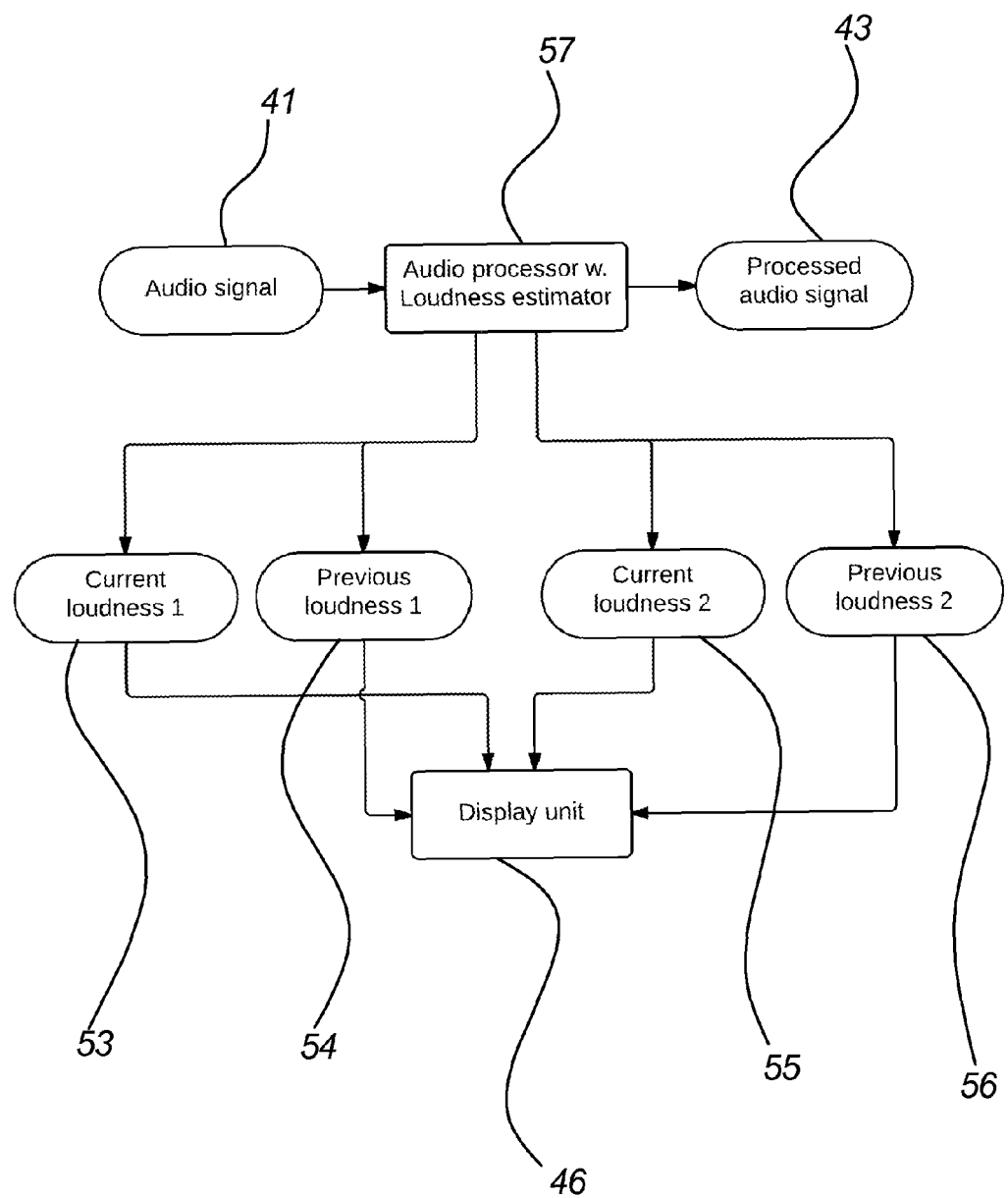

Furthermore, see the description of the embodiment in FIG. 12.

In an aspect the present invention relates to a loudness meter comprising a display unit and a loudness estimator, said loudness estimator being arranged to establish loudness estimates of a second audio signal and of a third audio signal, said second and said third audio signals being derived from a first audio signal by means of audio processing, said loudness meter being arranged to indicate representations of loudness estimates of the second audio signal and the third audio signal on said display unit, the representations comprising at least a representation of a current of said loudness estimates of each of the second audio signal and the third audio signal, and a representation of previous of said loudness estimates of each of the second audio signal and the third audio signal.

According to this embodiment, two signals originating from the same signal, e.g. by having undergone different degrees of processing, processing with different parameters, or having been through different processing paths, may be compared with respect to loudness, thus effectively obtaining a view of the difference in loudness influence by the two different ways that the two signals were derived from the first signal. The loudness meter indicates a measure for current loudness and a measure for previous loudness of the signals. By the term "derived by means of an audio processor" we mean by means of processing by one or more audio processors units, or by any other means of audio signal processing.

Figure 13:
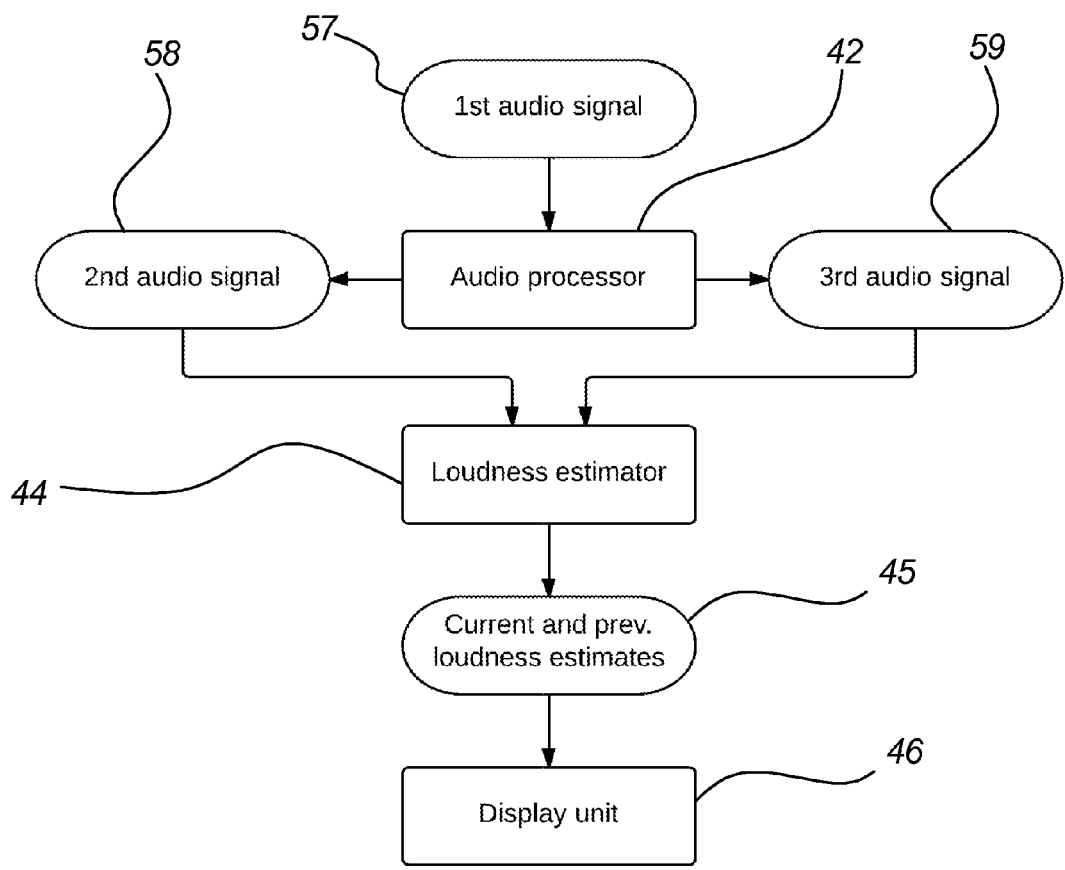

Furthermore, see the description of the embodiment in FIG. 13.

In a broadcast application embodiment, the audio engineer may wish to "loop back" the signal which is being broadcast, and compare it to the signal that is being transmitted from the station. These two versions of the program may have subtle differences, due to the different processing they have been subjected to—though they both stem from the signal that is being produced in the control room. Such differences in the loudness properties of the audio signal may be expected, whereas other differences may indicate a fault. Therefore, it may be desirable to compare the two signals, using the present invention.

In an embodiment a 'preset' of an audio processor may change a number of underlying parameters, controlling the processing. It may not always be clear to the user of the processor what the difference between two presets is. Thus, the user may employ the present invention as a means of comparing key loudness properties of an audio signal, processed using 2 different presets, and thereby quickly get an overview of their different effect.

It is noted that embodiments described above with regard to loudness metering an audio signal and a processed audio signal may also apply individually or in combination to this embodiment with respect to the second and third audio signal, respectively.

In an aspect the present invention relates to a loudness meter comprising a display unit and a loudness estimator, said loudness estimator being arranged to establish loudness estimates of an audio signal and of a processed audio signal, the audio signal being received in non-real-time and the processed audio signal being derived from said audio signal in non-real-time, said loudness meter being arranged to indicate representations of loudness estimates of the audio signal and of the processed audio signal on said display unit, the representations comprising at least a representation of said loudness estimates of each of the audio signal and the processed audio signal, and a summary representation of said loudness estimates of each of the audio signal and the processed audio signal.

When receiving and processing an audio signal, e.g. a file-based audio signal, faster than real-time, i.e. faster than a normal speed playback of the audio signal, i.e. offline processing, this embodiment of a loudness meter may provide a particularly advantageous way to evaluate processing parameters. For example, the variation of loudness throughout the audio signal, e.g. a radio programme for later broadcast, is provided to the user by the indication of instantaneous loudness estimates of the audio signal and processed audio signal respectively, thereby further enabling a way to compare pre- and post-processing situations by a glimpse at the display.

It is noted that embodiments described above with regard to loudness metering an audio signal and a processed audio signal, or a second and third audio signal, may also apply individually or in combination to this embodiment with respect to the audio signal and processed audio signal, respectively. In particular, embodiments described above referring to previous loudness estimates are also applicable to this embodiment with respect to the instantaneous loudness estimates.

In an advantageous embodiment said audio signal being received in faster than real-time and the processed audio signal being derived from said audio signal in faster than real-time, In an embodiment with a file-based audio processing system, each program, commercial, or audio track would be stored as a file—either the audio alone, or the audio integrated with video and/or meta-data. As a part of the "post production" step, an audio processor may process the audio in the files containing a complete production. It would be very time-consuming if an audio engineer or producer had to listen through the material again, after this processing. Nevertheless, it would be desirable for them to monitor the processing that had taken place, before passing the files on (e.g. to mastering, to transmission, or to the client it was produced for). The present invention may be useful in providing this information in a visual form, as both an overview via one or more key loudness properties (the summary representation) and a more detailed representation of the actual loudness estimates, of both the 'input' file and the processed file.

In an embodiment, the user may be adjusting the parameters of the audio processor(s). However, the effect of the adjustments may be difficult to hear immediately—especially if the user had not been trained in the particular processor(s) so he/she would know exactly what to expect for each parameter. In this case, the present invention may be used to display the loudness representation and summary, of both the input and the output to the processor(s). In case the processing takes place faster-than-realtime, the processor(s) and a loudness meter of the present invention may process say 30 sec of audio signal in only 5 sec. Thus the following interactive method could be employed in order to 'tune' the parameters if the processor: the user would make a setting; the processor (and loudness meter) would quickly process e.g. 30 sec of audio using that setting; the user would review the result via the display of the loudness meter; the user would then re-adjust one or more parameters; and the e.g. 30 sec audio would be processed again, with the revised parameters etc.

In an advantageous embodiment the summary representation is a representation of an integrated loudness.

In an advantageous embodiment the summary representation is a representation of a maximum loudness.

The maximum loudness may be the numerically highest of the loudness estimates, or it may be calculated using a different method, so as to obtain the 'maximum' that is most perceptually relevant. Thus, the maximum loudness would correspond to the part of the signal that would be perceived as being the loudest, which may be useful to know, as the user may wish to prevent the maximum from exceeding a certain threshold in order not to annoy the end-listener.

In an advantageous embodiment the summary representation is a representation of a loudness range.

In an aspect the present invention relates to a loudness meter comprising a display unit and a loudness estimator, said loudness estimator being arranged to establish loudness estimates of an audio signal and of a processed audio signal, the processed audio signal being derived from said audio signal, said loudness meter being arranged to indicate symmetrical representations of loudness estimates of the audio signal and of the processed audio signal on said display unit, the representations comprising at least a graphical representation of said loudness estimates of each of the audio signal and the processed audio signal, and a summary representation of said loudness estimates of each of the audio signal and the processed audio signal.

In a preferred embodiment, the audio signal and the processed audio signal may be the input and the output signals, respectively, of an audio processor. Thereby the present invention provides an advantageous visualization of the effective processing of the signal by the audio processor, i.e. how the estimated loudness is changed by the processing, easily perceivably due to the representations of input and output loudness being symmetrical. The processing may be real-time or offline.

By "symmetrical" is referred to the graphical and summary representations for the loudness estimates being of the same type for both audio signals.

The "graphical representation" may, for instance, comprise a distribution plot, histogram plot, or envelope plot, or any other visualization method for displaying the loudness estimates graphically.

A "summary representation" may e.g. be a numerical or graphical indication which summarizes some property based on the loudness estimates.

The representations may be updated or recomputed continuously in real-time, at time-intervals, or after a certain portion of the signal has been processed.

It is noted that embodiments described above with regard to loudness metering an audio signal and a processed audio signal may also apply individually or in combination to this embodiment.

Figure 14:
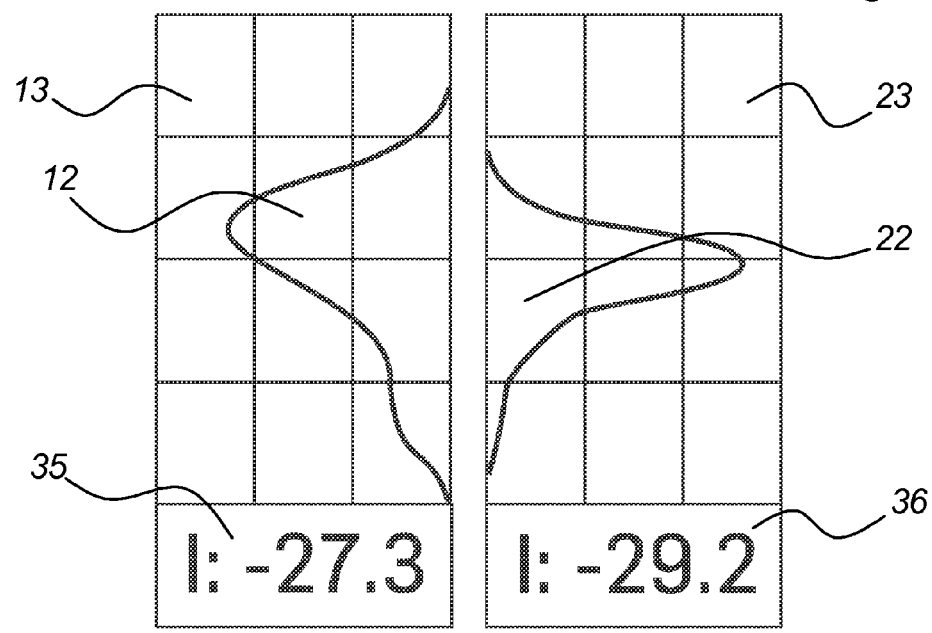

Furthermore, see the description of the embodiment in FIG. 14.

In an advantageous embodiment the summary representation is a representation of an integrated loudness.

In an advantageous embodiment the summary representation is a representation of a maximum loudness.

In an advantageous embodiment the summary representation is a representation of a loudness range.

In an aspect the present invention relates to a loudness metering method comprising the steps of: receiving an audio signal and a processed audio signal, the processed audio signal being derived from said audio signal; establishing loudness estimates of the audio signal and of the processed audio signal; indicating representations of loudness estimates of the audio signal and of the processed audio signal by means of a display unit; wherein the representations of loudness estimates comprise at least a representation of a current of said loudness estimates of each of the audio signal and the processed audio signal, and a representation of previous of said loudness estimates of each of the audio signal and the processed audio signal.

In an advantageous embodiment said representation of a current of said loudness estimates of the audio signal and of the processed audio signal and said representation of previous of said loudness estimates of the audio signal and of the processed audio signal are indicated with respect to a common loudness axis.

In an advantageous embodiment the axis orthogonal to a loudness axis, in the representation of previous of said loudness estimates, is a density axis and wherein said indication of a representation of previous of said loudness estimates is based on a histogram view or a continuous distribution view.

In an advantageous embodiment the axis orthogonal to a loudness axis, in the representation of previous of said loudness estimates, is a time axis.

In an advantageous embodiment the representations of loudness estimates comprise at least a representation of a loudness range of each of the audio signal and the processed audio signal on said display unit, wherein the loudness range represents an interval of loudness estimates consisting of an upper estimated value and a lower estimated value.

In an advantageous embodiment said representation of previous of said loudness estimates is stored as a quantized distribution.

In an advantageous embodiment said representation of previous of said loudness estimates is determined by means of a finite-length sliding window.

In an advantageous embodiment said loudness estimator is integrated with an audio processor and wherein said processed audio signal is derived from said audio signal by the audio processor.

DRAWINGS

Figure 4:
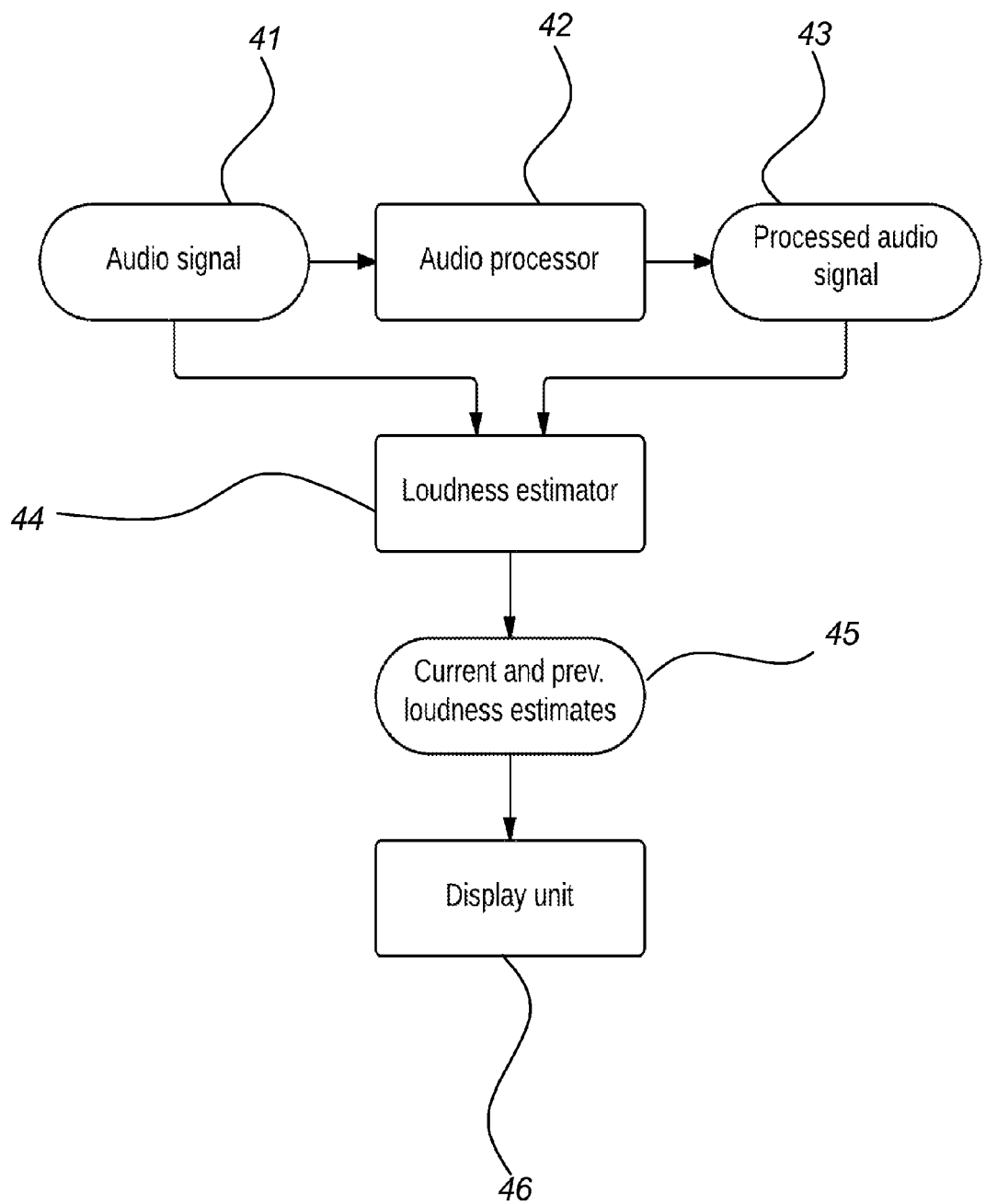
Figure 6:
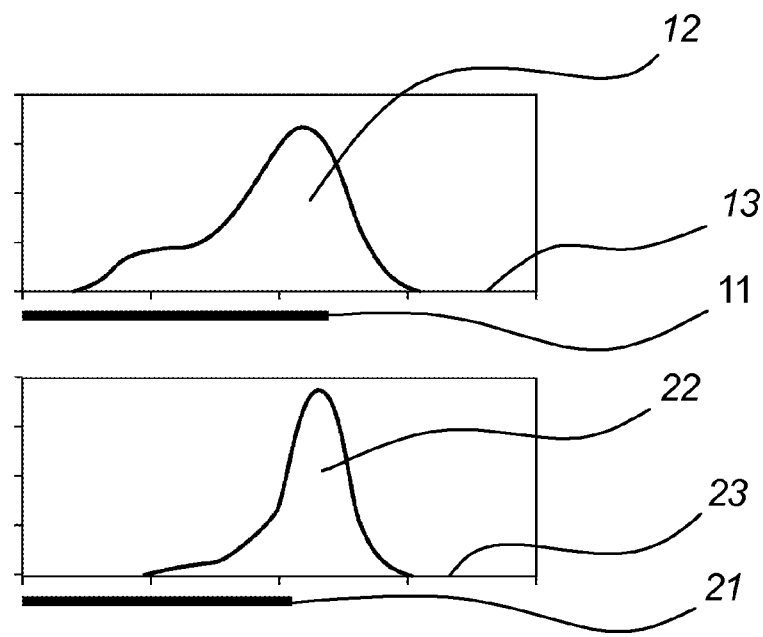
Figure 7:
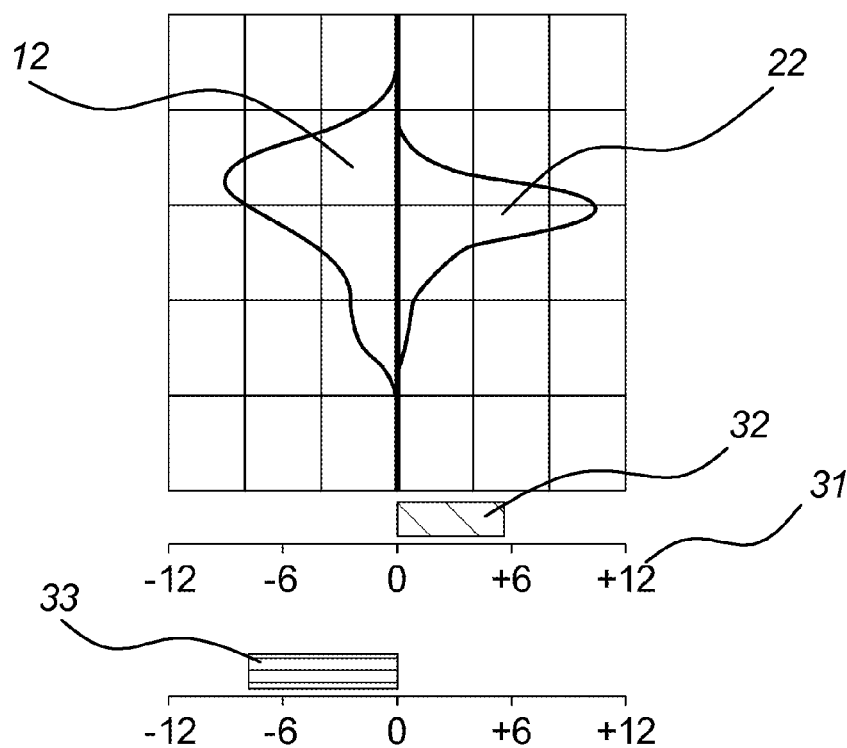
Figure 8:
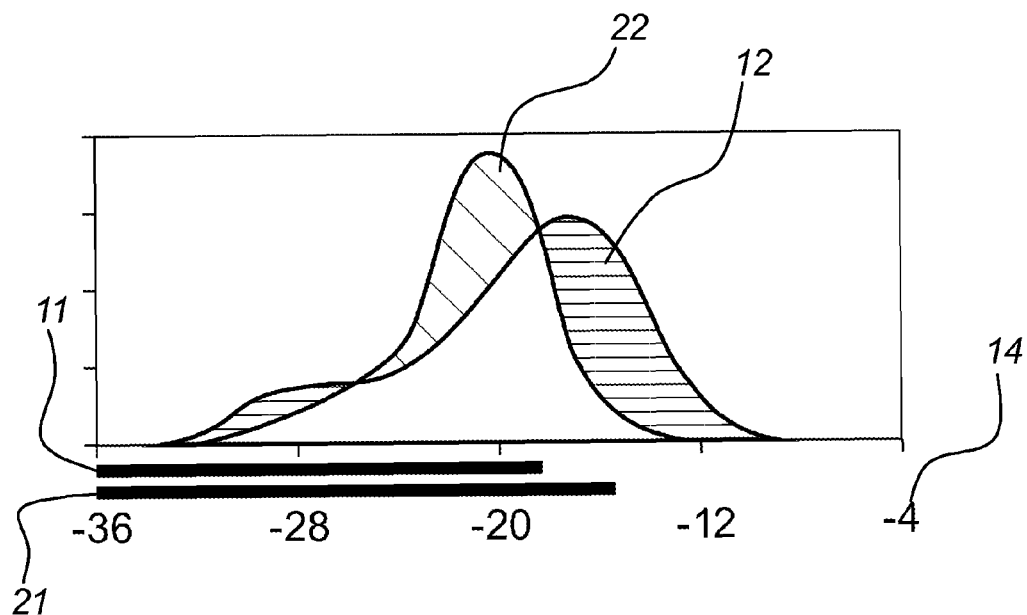

Various embodiments of the invention will in the following be described with reference to the drawings where FIG. 1 illustrates a prior art loudness meter, FIG. 2 illustrates an embodiment of the present invention, FIG. 3 illustrates a preferred embodiment of the present invention, FIG. 4 shows a diagram of an embodiment of the present invention, FIG. 5 illustrates an embodiment of the present invention, FIG. 6 illustrates an embodiment of the present invention, FIG. 7 illustrates an embodiment of the present invention, FIG. 8 illustrates an embodiment of the present invention, FIG. 9 illustrates an embodiment of the present invention, FIG. 10 shows a diagram of an embodiment of the present invention, FIG. 11 shows a diagram of an embodiment of the present invention, FIG. 12 shows a diagram of an embodiment of the present invention, FIG. 13 shows a diagram of an embodiment of the present invention, and FIG. 14 illustrates an embodiment of the present invention.

DETAILED DESCRIPTION OF THE EXAMPLE EMBODIMENTS

A loudness meter display according to prior art is shown in FIG. 1. It displays the current loudness level 1 and the previous loudness levels 2 over a period of time. In this meter, the previous loudness is represented in a circular fashion, such that the indication of the most recent (previous) loudness level 3 moves clockwise round the circle.

A scale with numerical units 4 shows the actual levels corresponding to the graphical indication of the current loudness 1. Concentric circles underlying the previous loudness graph indicate the levels of the previous loudness: For instance, the outer ring 5 may correspond to the level "0", whereas the inner ring 6 may correspond to the lower level "−15". The user may set parameters to determine the actual scales and time intervals measured and/or displayed by the loudness meter.

FIG. 2 illustrates an embodiment of the present invention. Current loudness levels of both the audio signal 11 and of the processed audio signal 21 are displayed as vertical bars. The two bars are positioned next to each other, to support an immediate visual comparison of the two levels; the difference between them corresponds to the effect the processing has on the loudness of the signal 'now'.

Previous loudness levels of both the audio signal 12 and of the processed audio signal 22 are also displayed, opposite each other. Each of the previous loudness estimates is represented as a continuous (level-)distribution 12, 22. In these plots, the vertical axis would correspond to the estimated loudness values or levels. The horizontal axis is a density axis, i.e., loudness levels having a high density would show the user that the signal has had those levels for a large proportion of the time. Both the level axis and the density axis of the two previous loudness distributions are preferably the same, as this implies that the area within the two distributions 12 and 22 is equal, i.e. only the shape differs.

In FIG. 2 the distributions are shown on a 5-by-3 grid, to give the user a visual reference. The distributions are shown as contour graphs, but may alternatively be solid or colored. The grids 13 and 23, underlying the two displays of the 'historic' levels, are positioned as mirror-images of each other, thus enabling the user to easily see the contrast between them.

A preferred embodiment of the invention is illustrated in FIG. 3. In addition to the elements described for FIG. 2, the advanced embodiment in FIG. 3 provides the following elements:

The current loudness levels 11 and 21 are shown as vertical bars, quantized into steps or segments, each corresponding to e.g. 1 unit of the measurement. Thereby the magnitude of the difference between the two bars is easier to assess.

Both the current and previous loudness estimates refer to the same axis or scale 14; furthermore the loudness of the signal and the processed signal share the same scale or axis 14 and 24, to support comparison by the user.

The previous loudness estimates or levels are divided into a (small) number of intervals, shown e.g. with different colours or shades 12, 15 and 16. The intervals are chosen as characteristic for the scale in question, e.g. "round numbers", or having a divisions at the target level or permitted maximum level or similar threshold levels relevant to the application. These divisions are shared by the signal and the processed signal 12 and 22, 15 and 25, 16 and 26. Thereby the user can clearly see, that e.g. the amount of "high" loudness levels is smaller in the processed signal 22 than for the original 12.

A loudness range indicator 17 and 27 shows the user within what range or interval the loudness level typically lies. Each loudness range corresponds to a characteristic lower and upper loudness level. These levels may be computed based on the previous loudness estimates, for instance using statistical parameters such as percentiles.

In FIG. 3, the loudness range of the signal and the processed signal are displayed as "brackets" opposite each other 17, 27. Thereby the user may easily compare both their length and their upper and lower endpoints, providing information about whether the processing 42 had resulted in a reduction or expansion of the loudness dynamic range. The two indicators would also clearly reveal if the processing had NOT changed the loudness dynamics but just the overall loudness level, as the two loudness range indicators would then be shifted on their axis but otherwise equal, e.g. same length.

In a preferred embodiment, the loudness range indicators are shown on the same scale or axis as the current and/or previous loudness 14, 24.

A special indicator shows the level of the integrated loudness 18 and 28, e.g. as a dot, marker or line. This corresponds to the overall loudness of a broadcast programme or a music track or album, such that the integrated loudness would measure the normalization level that a production may be required to match. The computation of the integrated loudness may be based on an average, mean, median loudness estimate, but its computation would depend on the method employed in computing the loudness estimates 44.

In a preferred embodiment, the integrated loudness indicators are represented on the same scale or axis 14, 24. Thereby the user may easily see whether the overall loudness of the processed audio 28 is higher than or lower than (or equal to) that of the unprocessed audio 18—and by how much.

FIG. 4 shows a diagram of an embodiment of the present invention. An audio signal 41 is processed by means of one or more audio processors 42 thereby producing the processed audio signal 43. Both audio signals are measured by a loudness estimator 44 producing estimates 45 of the current and previous loudness of both signals. Representations, e.g. graphically or numerically, of the loudness estimates are shown on the display unit 46.

The loudness estimator 44 may be implemented by a processing unit (CPU or DSP) and a storage unit (e.g. RAM). The processing unit would implement the filter banks, integrators, and level mappings etc. required by the particular loudness calculation method. The storage unit would store the previous loudness estimates, as well as the states and buffers needed by the processing unit. In an embodiment, a representation of the loudness meter's display, based on the loudness estimates 45, is rendered into the storage unit prior to its display, e.g. as a double-buffering. Thereby the updates of the display unit 46 may appear more smooth to the user.

The display unit 46 may be integrated into the loudness meter itself, or the display may be integrated into an external device or system.

In an embodiment, the audio signal 41, 43 is in the form of digital PCM samples, in one or more channels. In a preferred embodiment the loudness estimator 44 calculates one estimate, regardless of the number of channels, e.g. by combining their contributions. Thereby it would make no difference to the present invention if the number channels in the input signal 41 and the processed signal 43 was different, e.g. due to an up- or down-mixing audio processor 42. But the loudness estimator may alternatively calculate one estimate for each channel.

In a preferred embodiment, the loudness estimation 44 and rendering to the display unit 46 is implemented in the digital domain. Thus, if the audio signals 41, 43 were analog signals, an A/D-converter would be placed at the input of the loudness estimator 44.

It is understood that the rendering of the current and previous loudness estimates to the display unit 46 involves establishing a graphical and/or numerical visualization of the estimates. This may preferably be carried out by the same processing unit and storage unit used to implement the loudness estimator 44 as described above. Several embodiments of advantageous visualizations that may be used in this respect are described above and below with reference to FIGS. 2-3, 5-9 and 14.

An embodiment of a loudness meter of the present invention is shown in FIG. 5. It comprises several of the elements described above with regard to FIGS. 2 and 3 referred to with same reference numbers, and in addition, the advanced embodiment in FIG. 5 provides the following features:

The previous loudness estimates are represented as a number of 'bars', lines or markers together constituting a histogram-type of presentation 12, 22. Each bar would correspond to a certain interval of the loudness estimates. For instance, the scale may be partitioned into 10 or 100 such intervals, depending on the size, resolution and other properties of the display unit.

Such a display is simple for the user to read and understand. Moreover, the bars may be aligned with 'round' numbers on the corresponding scale or axis 14, 24. This would enable the user to easily compare the histograms corresponding to the signal and to the processed signal, as the bars would be aligned in the display, i.e. 'opposite bars' would correspond to the same interval of values.

In the embodiment, the loudness range indicators 17, 27 are shown "on the outside" of the bars showing the current loudness levels 11, 21. This has the further advantage that the user can easily see whether the current loudness is unusually high, i.e. if it was above the upper edge of the loudness range indicator, e.g. the bar 21 is above the top of range indicator 27. And vice versa for an unusually low current loudness.

FIG. 6 illustrates an embodiment of a loudness meter of the present invention. In addition to the elements described for FIG. 2 with same numerals but arranged differently in this embodiment, the embodiment in FIG. 6 provides the following features:

In this embodiment, the representation 11, 12, 13 of loudness estimates of the audio signal and representation 21, 22, 23 of loudness estimates of the processed audio signal are displayed separately. However, the layout of the two are identical, the scales of two horizontal level axes are identical and aligned above each other, and the two vertical (density) axes are also the same. Thereby, the user is still able to easily compare the two representations.

For example, in FIG. 6, the input current loudness 11 is clearly higher than the processed current loudness 21. Furthermore, the input loudness distribution 12 is clearly wider than the processed version 22, i.e. the loudness dynamics has apparently been compressed by the processing, in the example.

FIG. 7 illustrates an embodiment of a loudness meter of the present invention. In addition to the elements described for FIG. 2 with same numerals but arranged differently in this embodiment, the embodiment in FIG. 7 provides the following features:

An embodiment represents the current loudness of the audio signal and of the processed audio signal as the difference between their values. Displaying a single relative value may in some applications be preferable to the display of the two absolute values. For example if the current input and output had roughly the same level, this would be easy for the user to detect as a "0" difference, i.e. exactly at the middle of the scale 31.

Positive and negative difference in current loudness may be displayed in different colors, thereby emphasizing the direction of change currently performed by the audio processing. Thus, the user would immediately be able to see a loudness change 'trend' of the processing. In the example given in FIG. 7 with reference numeral 32, the current loudness representation 32 shows approximately a relative level of +5.5, i.e. the processed signal is 5.5 units louder (in the units employed by the loudness estimator). Analogously, in the alternative example given in FIG. 7 with reference numeral 33, the current loudness representation 33 shows a relative level of approximately −8 units.

Note that both the positive and negative differences 32, 33 are provided here for illustration purposes only—the embodiment would only show one of 32 and 33 at any given time.

An embodiment of a loudness meter of the present invention is shown in FIG. 8. It comprises several of the elements described above with regard to FIGS. 2 and 3 referred to with same reference numbers, and in addition, the embodiment in FIG. 8 provides the following features:

In an embodiment the previous loudness estimates of the audio signal 12 and of the processed audio signal 22 are represented in the same graph. Thereby the similarities and difference between them can be seen directly and in detail, by the user. Both the two distributions of previous loudness are shown, as well as the differences between them, which may be highlighted or colored. For example, the distribution of the previous loudness of the original signal 12 is shown to have an area of high loudness levels, roughly between −17 and −11, that were not present in the loudness of the processed signal 22. In preferred embodiments, the area of the two distributions are equal, so a corresponding area is present only in the processed signal, roughly between −24 and −19 on the loudness scale 14.

The embodiment in FIG. 8 displays the current loudness estimates 11, 21 as horizontal bars, sharing the same level scale 14 as used as horizontal axis for the previous loudness graphs 12, 22.

FIG. 9 illustrates an embodiment of a loudness meter according to the present invention, wherein the previous loudness estimates 19 and 29 for the audio signal and the processed audio signal, respectively, are represented on a time axis. In FIG. 9, a time axis 34 shows the previous time from "0", the most recent past, to "120" indicating e.g. 120 minutes ago. The time axis could e.g. use units of seconds, minutes, hours, days, video frames, or any other unit of time. In a preferred embodiment, the user is able to change the interval of previous loudness estimates shown.

In an embodiment, the user would be able to see the estimates or levels at specific times in the past, where the time may be marked as absolute ('wall clock') time. This is advantageous if the user needs to inspect the processing of a certain passage or event in the program.

The levels of the previous loudness estimates are indicated on a loudness axis 14. This axis is also used to show current loudness estimates 11 and 21 for the audio signal and the processed audio signal, respectively. The current estimates are represented as circles 11, 21 in FIG. 9, but may comprise any indicator shape. In an embodiment, the loudness estimator employs the same method for computing the current and previous loudness; thereby the previous loudness at time "0" is equal to the current levels 11 and 19, 21 and 29, respectively.

FIG. 10 shows a diagram of an embodiment of the present invention, which in addition to elements described above with reference to FIG. 4 with like numerals, further provides the following features:

In an embodiment current loudness estimates 53, 55 for the audio signal 41 and the processed audio signal 43, respectively, are computed according to one method by a first loudness estimator 51 denoted by 'A', and the previous loudness estimates 54, 55 for the audio signal 41 and the processed audio signal 43, respectively, are computed according to a different method by a second loudness estimator 52 denoted by 'B'. This may be advantageous when certain requirements apply to the visual 'ballistics' of the current loudness, that is, to obtain a certain dynamic behaviour of the loudness meter, such as a certain maximum fallback rate.

Such requirements may improve the display of the current loudness levels but may not apply to the previous loudness estimates, as their 'dynamics' are only observed in the history as a whole, e.g. a distribution or envelope graph.

In a preferred embodiment, each type of loudness estimator, e.g. loudness estimator 'A' 51, is used to provide the loudness estimates of both the signal 41 and the processed signal 43. This gives an implementational advantage, as the dual use of the loudness estimator may yield a reduced code size and potential DSP optimizations by the identical processing of the two "data" in parallel. A further advantage is that the user can be completely certain that each loudness estimate of two signals are indeed processed by the same method with same parameters etc.

FIG. 11 shows a diagram of an embodiment of the present invention, which in addition to elements described above with reference to FIG. 4 with like numerals, further provides the following features:

In an embodiment the previous loudness estimates 54, 56 for the audio signal 41 and the processed audio signal 43, respectively, are computed by the loudness estimator 44 based on current loudness estimates 53, 55, respectively, for the audio signal 41 and the processed audio signal 43, respectively.

The loudness estimator 44 may be implemented to downsample the current loudness estimates 53, 55, possibly after filtering them with a lowpass or smoothing filter, to achieve a lower rate of the previous estimates 54, 56, hence requiring less memory to store. Moreover, the subsequent computations involving the previous loudness estimates 54, 56 may be faster as less data need to be processed.

In an embodiment, the loudness estimator 44 may integrate consecutive estimates into a single representative loudness value, each of which are then stored instead of the original estimates, hence requiring less memory. When computing such representative values, a linear integration filter may be employed, for instance, if the 'energy' in the loudness estimates needs to be preserved. Alternatively, a non-linear filter, such as a median filter, may be employed if dynamic and/or smoothness properties are more important.

FIG. 12 shows a diagram of an embodiment of the present invention, which in addition to elements described above with reference to FIG. 11 with like numerals, further provides the following features:

In an embodiment of the present invention, the loudness estimator 44 is shared by the loudness meter and the audio processor 57, either in full or in part. It may be that the loudness estimates of the input signal 41 and/or the output signal 43 are computed by the audio processor 57 in order to perform its loudness-controlling processing. In this case, separate loudness estimator(s) for the embodiment of the present invention may be simplified or omitted entirely, to the extent the loudness estimator(s) of the audio processor can take their place. This implementation is advantageous to the manufacturer and user of the audio processor, as the simplification described may lead to a reduction in cost and/or operational resources.

Note that, sharing the loudness estimator between the audio processor and loudness meter may be possible both when the display unit 46 is integrated within the audio processor 57 and when the display unit 46 is external to the processor.

FIG. 13 shows a diagram of an embodiment of the present invention, which in addition to elements described above with reference to FIG. 4 with like numerals, further provides the following features:

An first audio signal 57 is processed by means of one or more audio processors 42 thereby producing a second audio signal 58 and a third audio signal 59. The audio signals 58, 59 are both processed versions of the first signal 57. In an embodiment the processing applied to the second signal 58 and to the third signal 59 is not the same. Thereby the loudness meter effectively measures how or if the different processing affects the loudness differently. In an embodiment, the processing of one of the signals essentially involves no transformation of the signal.

FIG. 14 illustrates a loudness meter according to an embodiment of the invention. The previous loudness estimates of the audio signal 12 and the previous loudness estimates of the processed audio signal 22 are displayed, opposite each other. Each of the previous loudness estimates is represented as a continuous (level-)distribution 12, 22. The two distributions are displayed in a symmetrical fashion—in this example the bottom of each distribution plot are aligned, i.e. sharing the same loudness level scale; the density axes of the two plots, i.e. the horizontal axes, are also the same, and thus the area of the two distributions would be equal. Thereby the user can easily compare the shape of the distributions.

In FIG. 14, each of the distributions are shown on a 5-by-3 grid 13, 23, to give the user a visual reference. The grids are positioned symmetrically, as mirror-images of each other, thus enabling the user to easily see the contrast between them.

For each of the audio signal and processed audio signal, a summary representation 35, 36 is shown. In this embodiment, a numerical indication of the integrated loudness ("I") is displayed, as a summary of the overall or total loudness of the respective signal, based on the loudness estimates. Thereby, the user will immediately be able to compare key loudness properties between the two signals, and determine to what degree they differ, and if that change was desirable or not.

The graphical display of the distributions, and the numerical display of the integrated loudness (i.e. a summary of the loudness estimates) complement each other. Together they provide the user with a clear yet detailed overview of the loudness properties of both the signals, as well as the change performed by the audio processing. Such an overview is especially useful when the processing has been performed in non-realtime—e.g. batch processing of files—as the user will be able to quickly get an overview of the processing in the display of the present invention.

What is claimed is:

1. A loudness meter comprising a display unit and a loudness estimator, said loudness estimator being arranged to establish loudness estimates of an audio signal and of a processed audio signal, the processed audio signal being derived from said audio signal, said loudness meter being arranged to indicate symmetrical representations of loudness estimates of the audio signal and of the processed audio signal on said display unit, the representations comprising at least a graphical representation of said loudness estimates of each of the audio signal and the processed audio signal, the graphical representation of said loudness estimates comprising at least a representation of previous of said loudness estimates of each of the audio signal and the processed audio signal being arranged with respect to a loudness axis and a density axis, and a summary representation of said loudness estimates of each of the audio signal and the processed audio signal;

wherein said graphical representation of said loudness estimates further comprises at least a representation of a current of said loudness estimates of each of the audio signal and the processed audio signal.

2. The loudness meter of claim 1, wherein the summary representation is a representation of an integrated loudness.

3. The loudness meter of claim 1, wherein the summary representation is a representation of a maximum loudness.

4. The loudness meter of claim 1, wherein the summary representation is a representation of a loudness range.

5. The loudness meter of claim 1, wherein the graphical representation of said loudness estimates comprises a histogram or continuous distribution view.

6. The loudness meter of claim 1, wherein the summary representation of said loudness estimates is a graphical summary representation.

7. The loudness meter of claim 1, wherein said processed audio signal is derived from said audio signal in faster than real-time.

8. The loudness meter of claim 1, wherein said symmetrical representations of loudness estimates comprises a same type of representation for the audio signal and the processed audio signal, respectively.

9. The loudness meter of claim 1, wherein said symmetrical representations of loudness estimates of the audio signal and the processed audio signal comprises representations each with respect to a graphically common axis and a graphically separate axis.

10. The loudness meter of claim 1, wherein said symmetrical representations of loudness estimates of the audio signal and the processed audio signal comprises being grids positioned symmetrically as mirror-images of each other.

* * * * *